US007365560B2

(12) United States Patent
Uh et al.

(10) Patent No.: US 7,365,560 B2
(45) **Date of Patent: *Apr. 29, 2008**

(54) APPARATUS AND METHOD FOR TESTING LIQUID CRYSTAL DISPLAY PANEL

(75) Inventors: Ji-Heum Uh, Seoul (KR); Sang-Sun Shin, Kyoungsangbuk-Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/008,140

(22) Filed: Dec. 10, 2004

(65) Prior Publication Data

US 2005/0099204 A1 May 12, 2005

Related U.S. Application Data

(60) Continuation of application No. 10/790,088, filed on Mar. 2, 2004, now Pat. No. 6,850,088, which is a division of application No. 10/260,569, filed on Oct. 1, 2002, now Pat. No. 6,781,402.

(30) Foreign Application Priority Data

Mar. 6, 2002 (KR) .............................. 2002-11969

(51) Int. Cl.
*G01R 31/00* (2006.01)

(52) U.S. Cl. ...................................................... 324/770

(58) Field of Classification Search ..................... None
See application file for complete search history.

(56) References Cited

U.S. PATENT DOCUMENTS

| | | | |
|---|---|---|---|
| 3,978,580 | A | 9/1976 | Leupp et al. |
| 4,094,058 | A | 6/1978 | Yasutake et al. |
| 4,653,864 | A | 3/1987 | Baron et al. |
| 4,691,995 | A | 9/1987 | Yamazaki et al. |
| 4,775,225 | A | 10/1988 | Tsuboyama et al. |
| 5,247,377 | A | 9/1993 | Omeis et al. |
| 5,263,888 | A | 11/1993 | Ishihara et al. |
| 5,379,139 | A | 1/1995 | Sato et al. |
| 5,406,989 | A | 4/1995 | Abe |
| 5,499,128 | A | 3/1996 | Hasegawa et al. |
| 5,507,323 | A | 4/1996 | Abe |
| 5,511,591 | A | 4/1996 | Abe |
| 5,539,545 | A | 7/1996 | Shimizu et al. |
| 5,548,429 | A | 8/1996 | Tsujita |

(Continued)

FOREIGN PATENT DOCUMENTS

EP 1 003 066 A1 5/2000

(Continued)

*Primary Examiner*—Ha Tran Nguyen
*Assistant Examiner*—Trung Q. Nguyen
(74) *Attorney, Agent, or Firm*—McKenna Long & Aldridge, LLP

(57) ABSTRACT

An apparatus and a method testing liquid crystal display panel which are able to test whether or not burr remains on longer sides and on shorter sides of a unit liquid crystal display panel using first to fourth testing bars in a touch method, and able to measure a distance between the longer sides and a distance between the shorter sides of the unit liquid crystal display panel.

10 Claims, 8 Drawing Sheets

U.S. PATENT DOCUMENTS

| | | | | |
|---|---|---|---|---|
| 5,642,214 | A | 6/1997 | Ishii et al. | |
| 5,680,189 | A | 10/1997 | Shimizu et al. | |
| 5,742,370 | A | 4/1998 | Kim et al. | |
| 5,757,451 | A | 5/1998 | Miyazaki et al. | |
| 5,852,484 | A | 12/1998 | Inoue et al. | |
| 5,854,664 | A | 12/1998 | Inoue et al. | |
| 5,861,932 | A | 1/1999 | Inata et al. | |
| 5,875,922 | A | 3/1999 | Chastine et al. | |
| 5,952,676 | A | 9/1999 | Sato | |
| 5,952,678 | A | 9/1999 | Ashida | |
| 5,956,112 | A | 9/1999 | Fujimori et al. | |
| 6,001,203 | A | 12/1999 | Yamada et al. | |
| 6,011,609 | A | 1/2000 | Kato et al. | |
| 6,016,178 | A | 1/2000 | Kataoka et al. | |
| 6,016,181 | A | 1/2000 | Shimada | |
| 6,055,035 | A | 4/2000 | Von Gutfeld et al. | |
| 6,163,357 | A | 12/2000 | Nakamura | |
| 6,219,126 | B1 | 4/2001 | von Gutfeld | |
| 6,226,067 | B1 | 5/2001 | Nishiguchi et al. | |
| 6,236,445 | B1 | 5/2001 | Foschaar et al. | |
| 6,304,306 | B1 | 10/2001 | Shiomi et al. | |
| 6,304,311 | B1 | 10/2001 | Egami | |
| 6,337,730 | B1 | 1/2002 | Ozaki et al. | |
| 6,414,733 | B1 | 7/2002 | Ishikawa et al. | |
| 6,583,643 | B2 * | 6/2003 | Lin | 324/770 |
| 6,590,624 | B1 * | 7/2003 | Lee | 349/54 |
| 6,850,088 | B2 * | 2/2005 | Uh et al. | 324/770 |

FOREIGN PATENT DOCUMENTS

| | | |
|---|---|---|
| JP | 51-65656 | 6/1976 |
| JP | 57-038414 | 3/1982 |
| JP | 57038414 | 3/1982 |
| JP | 57-088428 | 6/1982 |
| JP | 57088428 | 6/1982 |
| JP | 58-027126 | 2/1983 |
| JP | 58027126 | 2/1983 |
| JP | 59-057221 | 4/1984 |
| JP | 59-195222 | 11/1984 |
| JP | 60-111221 | 6/1985 |
| JP | 60-164723 | 8/1985 |
| JP | 60164723 | 8/1985 |
| JP | 60-217343 | 10/1985 |
| JP | 60217343 | 10/1985 |
| JP | 61-007822 | 1/1986 |
| JP | 61007822 | 1/1986 |
| JP | 61-055625 | 3/1986 |
| JP | 61055625 | 3/1986 |
| JP | S62-054225 | 3/1987 |
| JP | S62-054228 | 3/1987 |
| JP | 62-089025 | 4/1987 |
| JP | 62-090622 | 4/1987 |
| JP | 62089025 | 4/1987 |
| JP | 62090622 | 4/1987 |
| JP | 62-205319 | 9/1987 |
| JP | 62205319 | 9/1987 |
| JP | S62-054229 | 9/1987 |
| JP | 63-109413 | 5/1988 |
| JP | 63-110425 | 5/1988 |
| JP | 63-128315 | 5/1988 |
| JP | 63109413 | 5/1988 |
| JP | 63110425 | 5/1988 |
| JP | 63128315 | 5/1988 |
| JP | 63-311233 | 12/1988 |
| JP | 63311233 | 12/1988 |
| JP | H03-009549 | 1/1991 |
| JP | H05-036425 | 2/1993 |
| JP | H05-036426 | 2/1993 |
| JP | H05-107533 | 4/1993 |
| JP | 05-127179 | 5/1993 |
| JP | 05127179 | 5/1993 |
| JP | 05-154923 | 6/1993 |
| JP | 05-265011 | 10/1993 |
| JP | 05-281557 | 10/1993 |
| JP | 05-281562 | 10/1993 |
| JP | 05265011 | 10/1993 |
| JP | 05281557 | 10/1993 |
| JP | 05281562 | 10/1993 |
| JP | H06-018829 | 1/1994 |
| JP | 06-051256 | 2/1994 |
| JP | 06051256 | 2/1994 |
| JP | H06-064229 | 3/1994 |
| JP | 06-148657 | 5/1994 |
| JP | 06148657 | 5/1994 |
| JP | 06-160871 | 6/1994 |
| JP | 6160871 | 6/1994 |
| JP | H06-194637 | 7/1994 |
| JP | 06-235925 | 8/1994 |
| JP | 06-265915 | 9/1994 |
| JP | 06265915 | 9/1994 |
| JP | 06-313870 | 11/1994 |
| JP | 07-084268 | 3/1995 |
| JP | 07-128674 | 5/1995 |
| JP | 07128674 | 5/1995 |
| JP | 07-181507 | 7/1995 |
| JP | 07181507 | 7/1995 |
| JP | H07-275770 | 10/1995 |
| JP | H07-275771 | 10/1995 |
| JP | 08-078122 | 3/1996 |
| JP | H08-076133 | 3/1996 |
| JP | 08-095066 | 4/1996 |
| JP | 08-101395 | 4/1996 |
| JP | 08-106101 | 4/1996 |
| JP | 08095066 | 4/1996 |
| JP | 08106101 | 4/1996 |
| JP | H08-110504 | 4/1996 |
| JP | H08-136937 | 5/1996 |
| JP | 08-171094 | 7/1996 |
| JP | 08-190099 | 7/1996 |
| JP | 08171094 | 7/1996 |
| JP | 08190099 | 7/1996 |
| JP | H08-173874 | 7/1996 |
| JP | 08-240807 | 9/1996 |
| JP | 08240807 | 9/1996 |
| JP | 09-005762 | 1/1997 |
| JP | 09-026578 | 1/1997 |
| JP | 09005762 | 1/1997 |
| JP | 09026578 | 1/1997 |
| JP | H09-001026 | 1/1997 |
| JP | 09-311340 | 2/1997 |
| JP | 09-61829 | 3/1997 |
| JP | 09-073075 | 3/1997 |
| JP | 09-073096 | 3/1997 |
| JP | 09073075 | 3/1997 |
| JP | 09073096 | 3/1997 |
| JP | H09-094500 | 4/1997 |
| JP | 09-127528 | 5/1997 |
| JP | 09127528 | 5/1997 |
| JP | 09-229965 | 9/1997 |
| JP | 09-230357 | 9/1997 |
| JP | 09230357 | 9/1997 |
| JP | 09-281511 | 10/1997 |
| JP | 09281511 | 10/1997 |
| JP | 09311340 | 12/1997 |
| JP | 10-123537 | 5/1998 |
| JP | 10-123538 | 5/1998 |
| JP | 10-142616 | 5/1998 |
| JP | 10123537 | 5/1998 |
| JP | 10123538 | 5/1998 |
| JP | 10142616 | 5/1998 |
| JP | 10-153401 | 6/1998 |
| JP | 10-177178 | 6/1998 |
| JP | H10-174924 | 6/1998 |
| JP | 10-221700 | 8/1998 |

| | | |
|---|---|---|
| JP | 10221700 | 8/1998 |
| JP | 10-282512 | 10/1998 |
| JP | 10282512 | 10/1998 |
| JP | 10-325958 | 12/1998 |
| JP | 10-333157 | 12/1998 |
| JP | 10-333159 | 12/1998 |
| JP | 11-014953 | 1/1999 |
| JP | 11014953 | 1/1999 |
| JP | 11-038424 | 2/1999 |
| JP | 11038424 | 2/1999 |
| JP | 11-064811 | 3/1999 |
| JP | 11064811 | 3/1999 |
| JP | 11-109388 | 4/1999 |
| JP | 11109388 | 4/1999 |
| JP | 11-133438 | 5/1999 |
| JP | 11-142825 | 5/1999 |
| JP | 11-142864 | 5/1999 |
| JP | 11-174477 | 7/1999 |
| JP | 11174477 | 7/1999 |
| JP | 11-212045 | 8/1999 |
| JP | 11212045 | 8/1999 |
| JP | 11-248930 | 9/1999 |
| JP | H11-262712 | 9/1999 |
| JP | H11-264991 | 9/1999 |
| JP | 11-326922 | 11/1999 |
| JP | 11-344714 | 12/1999 |
| JP | 11344714 | 12/1999 |
| JP | 2000-002879 | 1/2000 |
| JP | 2000-029035 | 1/2000 |
| JP | 2000029035 | 1/2000 |
| JP | 2000-039599 | 2/2000 |
| JP | 2000-056311 | 2/2000 |
| JP | 2000-066165 | 3/2000 |
| JP | 2000-066218 | 3/2000 |
| JP | 2000-093866 | 4/2000 |
| JP | 2000-137235 | 5/2000 |
| JP | 2000-147528 | 5/2000 |
| JP | 2000-193988 | 7/2000 |
| JP | 2000-218486 | 8/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-005401 | 1/2001 |
| JP | 2001-005405 | 1/2001 |
| JP | 2001-013506 | 1/2001 |
| JP | 2001-033793 | 2/2001 |
| JP | 2001-042341 | 2/2001 |
| JP | 2001-051284 | 2/2001 |
| JP | 2001-066615 | 3/2001 |
| JP | 2001-091727 | 4/2001 |
| JP | 2001-117105 | 4/2001 |
| JP | 2001-117109 | 4/2001 |
| JP | 2001117105 | 4/2001 |
| JP | 2001-133745 | 5/2001 |
| JP | 2001-133794 | 5/2001 |
| JP | 2001-133799 | 5/2001 |
| JP | 2001-142074 | 5/2001 |
| JP | 2001-147437 | 5/2001 |
| JP | 2001133794 | 5/2001 |
| JP | 2001142074 | 5/2001 |
| JP | 2001147437 | 5/2001 |
| JP | 2001-154211 | 6/2001 |
| JP | 2001-166272 | 6/2001 |
| JP | 2001-166310 | 6/2001 |
| JP | 2001154211 | 6/2001 |
| JP | 2001-183683 | 7/2001 |
| JP | 2001-201750 | 7/2001 |
| JP | 2001-209052 | 8/2001 |
| JP | 2001-209056 | 8/2001 |
| JP | 2001-209057 | 8/2001 |
| JP | 2001-209058 | 8/2001 |
| JP | 2001-209060 | 8/2001 |
| JP | 2001-215459 | 8/2001 |
| JP | 2001-222017 | 8/2001 |
| JP | 2001-235758 | 8/2001 |
| JP | 2001-255542 | 9/2001 |
| JP | 2001-264782 | 9/2001 |
| JP | 2001255542 | 9/2001 |
| JP | 2001264782 | 9/2001 |
| JP | 2001-272640 | 10/2001 |
| JP | 2001-281675 | 10/2001 |
| JP | 2001-281678 | 10/2001 |
| JP | 2001-282126 | 10/2001 |
| JP | 2001-305563 | 10/2001 |
| JP | 2001-330837 | 11/2001 |
| JP | 2001-330840 | 11/2001 |
| JP | 2001330840 | 11/2001 |
| JP | 2001-356353 | 12/2001 |
| JP | 2001-356354 | 12/2001 |
| JP | 2001356354 | 12/2001 |
| JP | 2002-014360 | 1/2002 |
| JP | 2002-023176 | 1/2002 |
| JP | 2002014360 | 1/2002 |
| JP | 2002023176 | 1/2002 |
| JP | 2002-049045 | 2/2002 |
| JP | 2002049045 | 2/2002 |
| JP | 2002-079160 | 3/2002 |
| JP | 2002-080321 | 3/2002 |
| JP | 2002-082340 | 3/2002 |
| JP | 2002-090759 | 3/2002 |
| JP | 2002-090760 | 3/2002 |
| JP | 2002082340 | 3/2002 |
| JP | 2002090759 | 3/2002 |
| JP | 2002090760 | 3/2002 |
| JP | 2002-107740 | 4/2002 |
| JP | 2002-122870 | 4/2002 |
| JP | 2002-122872 | 4/2002 |
| JP | 2002-122873 | 4/2002 |
| JP | 2002107740 | 4/2002 |
| JP | 2002122872 | 4/2002 |
| JP | 2002122873 | 4/2002 |
| JP | 2002-131762 | 5/2002 |
| JP | 2002-139734 | 5/2002 |
| JP | 2002-156518 | 5/2002 |
| JP | 2002-169166 | 6/2002 |
| JP | 2002-169167 | 6/2002 |
| JP | 2002-182222 | 6/2002 |
| JP | 2002080321 | 6/2002 |
| JP | 2002-202512 | 7/2002 |
| JP | 2002-202514 | 7/2002 |
| JP | 2002-214626 | 7/2002 |
| JP | 2002202512 | 7/2002 |
| JP | 2002202514 | 7/2002 |
| JP | 2002214626 | 7/2002 |
| JP | 2002-229042 | 8/2002 |
| JP | 2002-236276 | 8/2002 |
| JP | 2002-258299 | 8/2002 |
| JP | 2002-236292 | 9/2002 |
| JP | 2002-277865 | 9/2002 |
| JP | 2002-277866 | 9/2002 |
| JP | 2002-277881 | 9/2002 |
| JP | 2002-287156 | 10/2002 |
| JP | 2002-296605 | 10/2002 |
| JP | 2002-311438 | 10/2002 |
| JP | 2002-311440 | 10/2002 |
| JP | 2002-311442 | 10/2002 |
| JP | 2002-323687 | 11/2002 |
| JP | 2002-323694 | 11/2002 |
| JP | 2002-333628 | 11/2002 |
| JP | 2002-333635 | 11/2002 |
| JP | 2002-333843 | 11/2002 |
| JP | 2002-341329 | 11/2002 |
| JP | 2002-341355 | 11/2002 |

| | | |
|---|---|---|
| JP | 2002-341356 | 11/2002 |
| JP | 2002-341357 | 11/2002 |
| JP | 2002-341358 | 11/2002 |
| JP | 2002-341359 | 11/2002 |
| JP | 2002-341362 | 11/2002 |
| KR | 2000-0035302 | 6/2000 |

* cited by examiner

APPARATUS AND METHOD FOR TESTING LIQUID CRYSTAL DISPLAY PANEL

This application is a Continuation of prior application Ser. No. 10/790,088, filed Mar. 2, 2004; now U.S. Pat. No. 6,850,088 which is a Divisional of prior application Ser. No. 10/260,569, filed Oct. 1, 2002 now U.S. Pat. No. 6,781,402.

This application claims the benefit of the Korean Application No. P2002-011969 filed on Mar. 6, 2002, which is hereby incorporated by reference for all purposes as if fully set forth herein.

BACKGROUND OF THE INVENTION

1. Field of the Invention

The present invention relates to a liquid crystal display (hereinafter "LCD") panel, and more particularly, to an apparatus and a method for testing a size of a unit LCD panel and status of cut surface after cutting LCD panels fabricated on a large mother substrate into individual unit LCD panels.

2. Discussion of the Related Art

In general, an LCD device displays a desired picture by individually supplying a data signal according to picture information to the liquid crystal cell arranged in a matrix form and controlling light transmittance through liquid crystal molecules of the liquid crystal cells.

In the LCD device, TFT (hereinafter "TFT") array substrates are formed on a large mother substrate and color filter substrates are formed on an additional mother substrate. Then, by attaching the two mother substrates, a plurality of LCD panels are simultaneously formed. Because yield can be increased by simultaneously forming a plurality of LCD panels on a glass substrate of a large area, a process of cutting the attached two mother substrates into unit LCD panels is required.

Conventionally, the cutting processing includes forming a predetermined cutting line on the surface of the substrate with a pen having a higher hardness than the glass substrate and propagating a crack along the predetermined cutting line. The cutting process of the unit LCD panel will be described in detail with reference to the accompanied drawings.

FIG. 1 is a schematic plan view showing a unit LCD panel formed with a TFT array substrate and color filter substrate attached to face into each other.

In FIG. 1, the LCD panel 10 includes a picture display unit 13 having a plurality of liquid crystal cells arranged in a matrix form, a gate pad unit 14 connected to a plurality of gate lines of the picture display unit 13, and a data pad unit 15 connected to a plurality of data lines of the picture display unit 13.

The gate pad unit 14 and the data pad unit 15 are formed at the marginal portion of the TFT array substrate 1. The marginal portion does not overlap the color filter substrate 2.

The gate pad unit 14 supplies a scan signal supplied from the gate driver integrated circuit to the gate lines of the picture display unit 13. The data pad unit 15 supplies picture information supplied from the data driver integrated circuit to the data lines of the picture display unit 13.

The data lines receive picture information and the gate lines receive the scan signal. The data lines and gate lines cross orthogonally on the TFT array substrate 1 of the picture display unit 13. At each of the crossed portion, a thin film transistor (TFT) is formed for switching the liquid crystal cells that are defined by the crossing of the data and gate lines. A pixel electrode is formed in each liquid crystal cell to be connected to the TFT for driving the liquid crystal cell. Furthers a protective film is formed over the entire surface to protect the pixel electrode and the TFT.

A plurality of color filters are formed on the color filter substrate 2. The color filters for a cell region are separated from adjacent cell regions by a black matrix. Common transparent electrodes corresponding to the pixel electrodes are formed on the color filter substrate 2.

A cell gap is formed between the TFT array substrate 1 and the color filter substrate 2 so that the two substrates are spaced apart and face each other. The TFT array substrate 1 and the color filter substrate 2 are attached by a sealant (not shown) formed at the exterior of the picture display unit 13. A liquid crystal layer (not shown) is formed in the space between the TFT array substrate 1 and the color filter substrate 2.

FIG. 2 illustrates a cross-sectional view showing a plurality of unit LCD panels formed in the first mother substrate having the TFT array substrates and the second mother substrate having the color filter substrates.

As shown in FIG. 2, a plurality of unit LCD panels are formed in such a manner that one side of the unit LCD panel TFT array substrates 1 protrudes by as much as a dummy region 31 of the unit LCD panel color filter substrates.

The protrusion of the unit LCD panel is provided because the gate pad unit 14 and the data pad unit 15 are formed at the marginal portion provided by the protrusion where the TFT array substrates 1 and the color filter substrates 2 do not overlap.

Thus, the color filter substrates 2 formed on the second mother substrate 30 are formed to be isolated by as much as dummy regions 31 which correspond to the protrusions of the TFT array substrates 1.

Each unit LCD panel is disposed at the first and second mother substrates 20 and 30 so that the area of the first and the second mother substrates 20 and 30 are used at the maximum. Depending on a model of unit LCD panel being fabricated, the unit LCD panels are generally formed to be isolated by as much as the second dummy regions 32.

After the first mother substrate 20 where the TFT array substrates 1 are formed and the second mother substrate 30 where the color filter substrates 2 are formed are attached each other, the LCD panels are individually cut. The dummy regions 31 formed at the region where the color filter substrates 2 of the second mother substrate 30 are isolated and the second dummy regions 32 isolating the unit LCD panels, are simultaneously removed.

FIG. 3 is an exemplary view showing a testing apparatus for LCD panel according to related art.

As shown in FIG. 3, the testing apparatus comprises a first and a second testing bars 101 and 102 for testing the cutting status of longer sides of the unit LCD panel 100 (that is, a side where the data pad unit is formed and the opposite side of the unit LCD panel). A third and a fourth testing bars 103 and 104 for testing the cutting status of shorter sides of the unit LCD panel 100 (that is, a side where the gate pad unit is formed and the opposite of the unit LCD panel.

The first and second testing bars 101 and 102 test whether or not a burr remains on the longer sides of the unit LCD panel 100 in a touch method. The third and fourth testing bars 103 and 104 test whether or not a burr is remains on the shorter sides of the unit LCD panel 100 by the same method as the first and second testing bars 101 and 102.

On the other hand, the size of the unit LCD panel 100 can be varied according to the models of unit LCD panel being fabricated. Therefore, the first and second testing bars 101 and 102 and the third and fourth testing bars 103 and 104 are formed to have same lengths as the longer sides and the shorter sides, respectively of the largest unit LCD panel 100 that may be fabricated, and thereby, the test can be performed for all models of unit LCD panel 100.

Also, in the unit LCD panel 100, a color filter substrate 120 is stacked on a TFT array substrate 110, and two sides of the TFT array substrate 110 are formed to protrude beyond the color filter substrate 120. This is because that the gate pad unit and data pad unit are formed on the TFT array substrate 110 in a marginal portion that does not overlap the color filter substrate 120, as described with reference to FIG. 1.

Therefore, one of the longer sides and one of the shorter sides of the unit LCD panel 100 have a step shape. The first testing bar 101 corresponds to the one of the longer sides of the unit LCD panel 100 on which the data pad unit is formed. The third testing bar 103 corresponds to the one of the shorter sides of the unit LCD panel 100 on which the gate pad unit is formed. Thus, to test the longer sides of the unit LCD panel 100, the first testing bar 101 is formed to be engaged with the one of longer sides of the unit LCD panel 100 having the step shape. In addition, to test the shorter sides of the unit LCD panel 100, the third testing bar 103 is formed to be engaged with the one of shorter sides of the unit LCD panel 100 having the step shape.

Hereinafter, a testing method of unit LCD panel using the above apparatus will now be described with reference to the accompanying sequential exemplary views, FIGS. 4A to 4C.

As shown in FIG. 4A, the unit LCD panel 100 is loaded on a first table (not shown) including the first to fourth testing bars 101 to 104. At that time, the color filter substrate 120 is stacked on the TFT array substrate 110, and two sides of the TFT array substrate 110 are formed to protruded beyond the color filter substrate 120 by the gate pad unit and the data pad unit as described above. The first testing bar 101 is formed to be engaged with the one of the longer sides of the unit LCD panel 100 having the step shape caused by the data pad unit. The third testing bar 103 is formed to be engaged with the one of the shorter sides of the unit LCD panel 100 having the step shape caused by the gate pad unit.

Next, as shown in FIG. 4B, the first and second testing bars 101 and 102 test whether or not the burr remains on the longer sides of the unit LCD panel 100 in the touch method.

As shown in FIG. 4C, the third and fourth testing bars 103 and 104 test whether or not the burr remains on the shorter sides of the unit LCD panel 100 in the touch method.

As described above, the unit LCD panel 100 is determined whether it is fine or inferior by testing the longer and shorter sides of the unit LCD panel 100 using the first to fourth testing bars 101 to 104 in the touch method. After that, the unit LCD panels 100 that are fine are selected at a predetermined interval and are removed from the production line to test whether or not the cut size of the unit LCD panel 100 is appropriate using an extra measuring device.

According to the apparatus and the method for testing LCD panel of the related art, the burr remaining on the unit LCD panel is tested, and the unit LCD panel of good quality is extracted from the production line with a predetermined period to test whether or not the size of the cut unit LCD panel is appropriate using an extra measuring device. Therefore, an operator should move the unit LCD panel from the production line to the measuring device for testing the size of cut LCD panel and perform the size test on the measuring device.

The above processes are inconvenient, and the productivity is lowered since the time spent on testing the size of the cut unit LCD panel is increased.

In addition, an additional measuring device of high price is needed, and accordingly, costs for equipment and maintenance of the production line are increased, and thereby, the cost price of the product is also increased.

Also, the size test is performed by sampling the unit LCD panels a predetermined interval, and therefore, reliability of the test is lowered. In addition, if the unit LCD panel is determined to be inferior, the operation is stopped, and all unit LCD panels from the panel previously sampled to the panel which will be sampled next should be tested and determined whether they are inferior or fine. Therefore, the unit LCD panels which have undergone post-processes may be discarded, and accordingly, material and time can be wasted.

SUMMARY OF THE INVENTION

Accordingly, an advantage of the present invention is to provide an apparatus and a method for simplifying tests of size of LCD panel and of status of cut surface, after cutting the LCD panels formed on a large mother substrate into individual unit LCD panels.

To achieve the advantage of the present invention, as embodied and broadly described herein, there is provided an apparatus for testing an LCD panel including first and second testing bars corresponding to longer sides of a unit liquid crystal display panel testing for defect along a grinding edge of the unit liquid crystal display panel and measuring a distance between the longer sides of the unit liquid crystal display panel; and third and fourth testing bars corresponding to shorter sides of a unit liquid crystal display panel testing for defect along a grinding edge of the unit liquid crystal display panel and measuring a distance between the shorter sides of the unit liquid crystal display panel.

In addition, to achieve the object of the present invention, there is provided a method for testing an LCD panel including loading a unit liquid crystal display panel on a first table including first, second, third and fourth testing bars; and measuring a distance between the longer sides of the unit liquid crystal display panel while operating the first and second testing bars and a distance between the shorter sides of the unit liquid crystal display panel while operating the third and fourth testing bars.

The foregoing and other features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 8A and 8C is an exemplary view showing a method for testing LCD panel according to another embodiment of the present invention.

DETAILED DESCRIPTION OF THE ILLUSTRATED EMBODIMENTS

Reference will now be made in detail to the illustrated embodiments of the present invention, examples of which are illustrated in the accompanying drawings.

Figure 5:
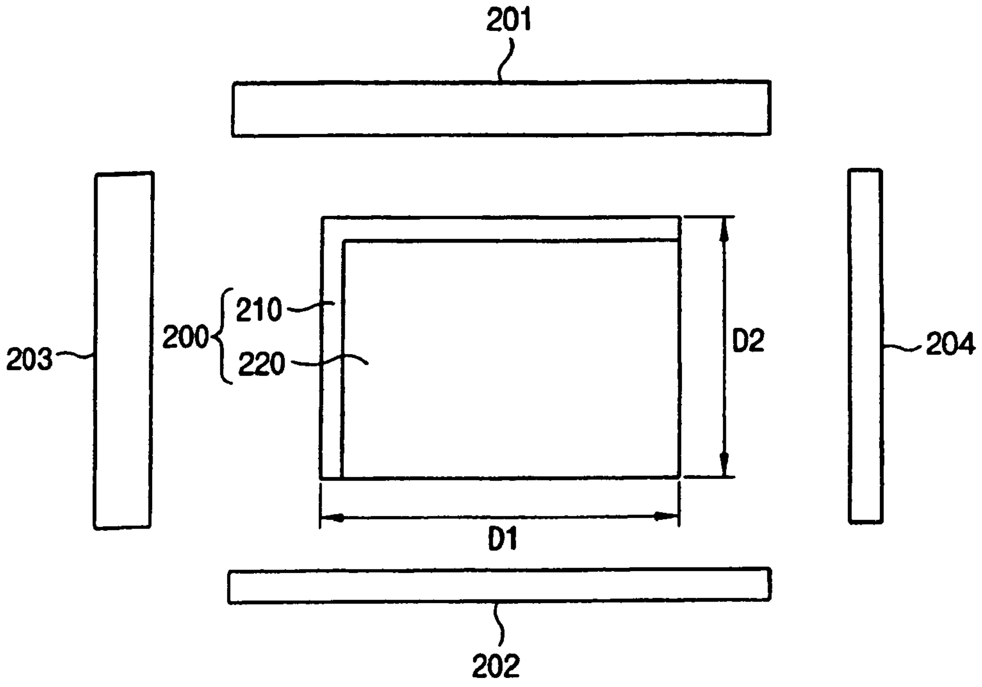
FIG. 5 is an exemplary view showing an apparatus for testing LCD panel according to an embodiment of the present invention.

FIG. 5 is an exemplary view showing an apparatus for testing an LCD panel according to an embodiment of the present invention. As shown therein, the apparatus for testing an LCD panel comprises a first and a second testing bars 201 and 202 for testing cutting status of longer sides of a unit LCD panel 200 (that is, a side where a data pad unit is formed and an opposite side of the unit LCD panel), and for measuring a distance (D1) between the longer sides of the unit LCD panel 200, and a third and a fourth testing bars 203 and 204 for testing cutting status of shorter sides of the unit LCD panel 200 (that is, a side where a gate pad unit is formed and an opposite side of the LCD panel), and for measuring a distance (D2) between the shorter sides of the unit LCD panel 200.

The first and second testing bars 201 and 202 test whether or not a burr defect remains on the longer sides of the unit LCD panel 200 in a touch method and measure the distance D1 between the longer sides of the unit LCD panel 200. In addition, the third and fourth testing bars 203 and 204 test whether or not a burr defect remains on the shorter sides of the unit LCD panel 200 in same method as that of the first and second testing bars 201 and 202 and measure the distance (D2) between the shorter sides of the unit LCD panel 200.

On the other hand, the size of the unit LCD panel vary according to model, and therefore, it is desirable that the first and second testing bars 201 and 202 and the third and fourth testing bars 203 and 204 are formed to have lengths corresponding to the longer sides and shorter sides of the largest unit LCD panel 200 to be tested so that the testing bars be applied to all models of the unit LCD panel 200. In addition, it is desirable that the first to fourth testing bars 201 to 204 measure the distance D1 between the longer sides of the unit LCD panel 200 and the distance D2 between the shorter sides of the unit LCD panel 200 using a gauge built therein.

Figure 1:
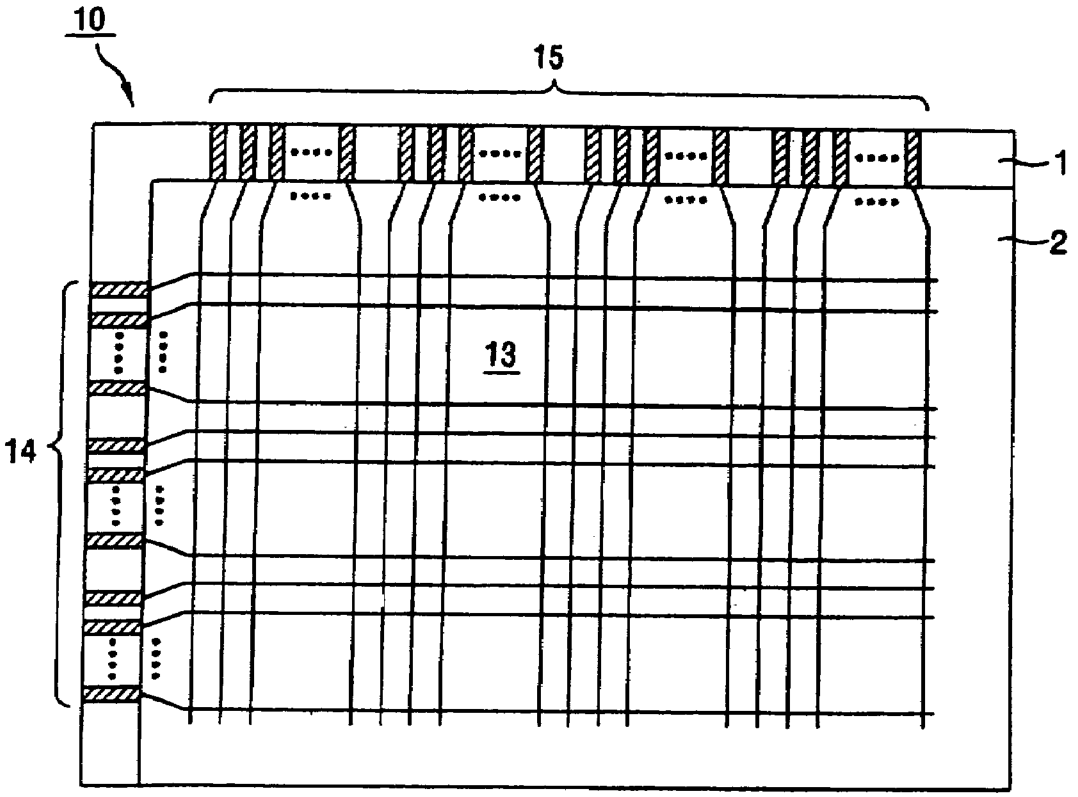
FIG.1 RELATED ART
FIG. 1 is a plan view illustrating a unit LCD panel formed in the TFT array substrate and a color filter substrate for an LCD device, which are attached to face into each other.
Figure 2:
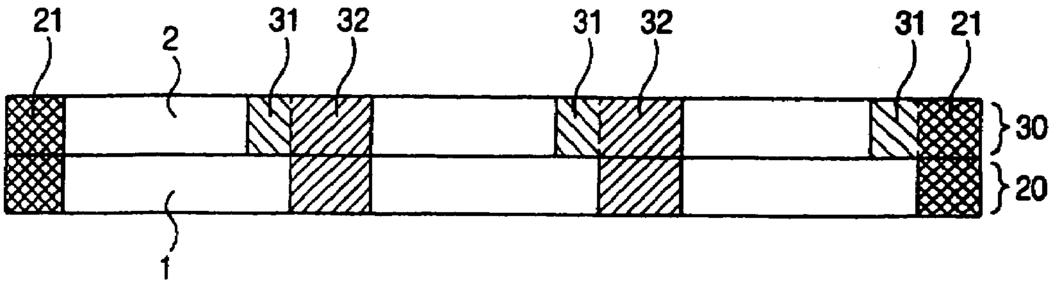
FIG.2 RELATED ART
FIG. 2 is a cross-sectional view showing a plurality of LCD panels formed in the first mother substrate including the TFT array substrates and the second mother substrate with the color filter substrate of FIG. 1.
Figure 3A:
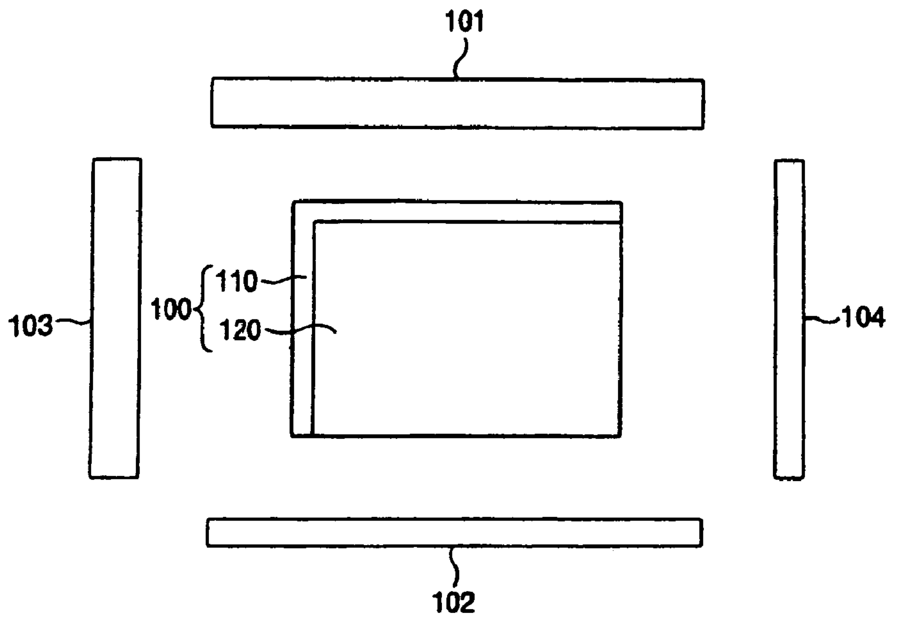
FIG.3A RELATED ART
FIG. 3 is an exemplary view showing an apparatus for testing LCD panel according to the related art.
Figure 3B:
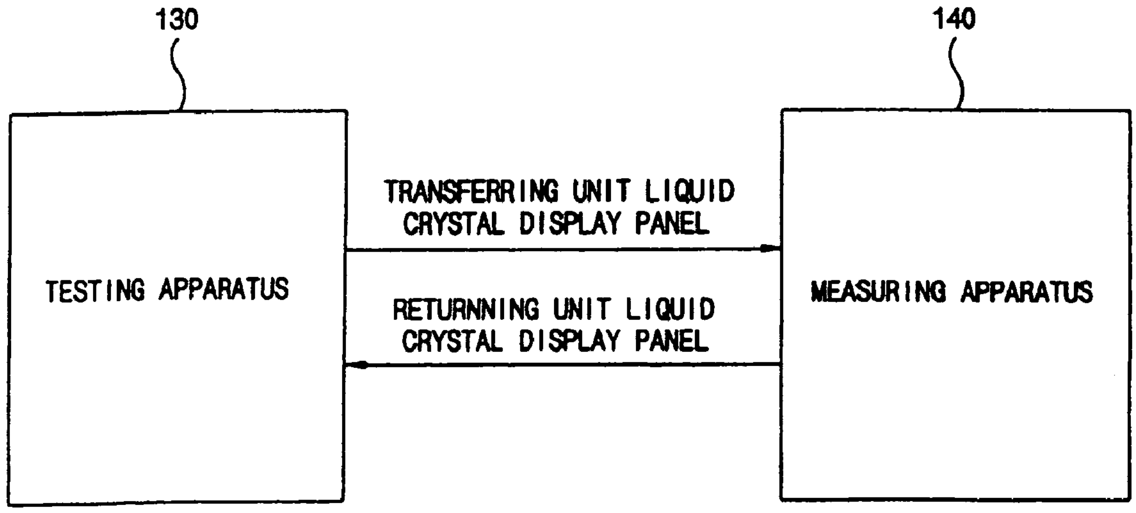
FIG.3B RELATED ART
Figure 4A:
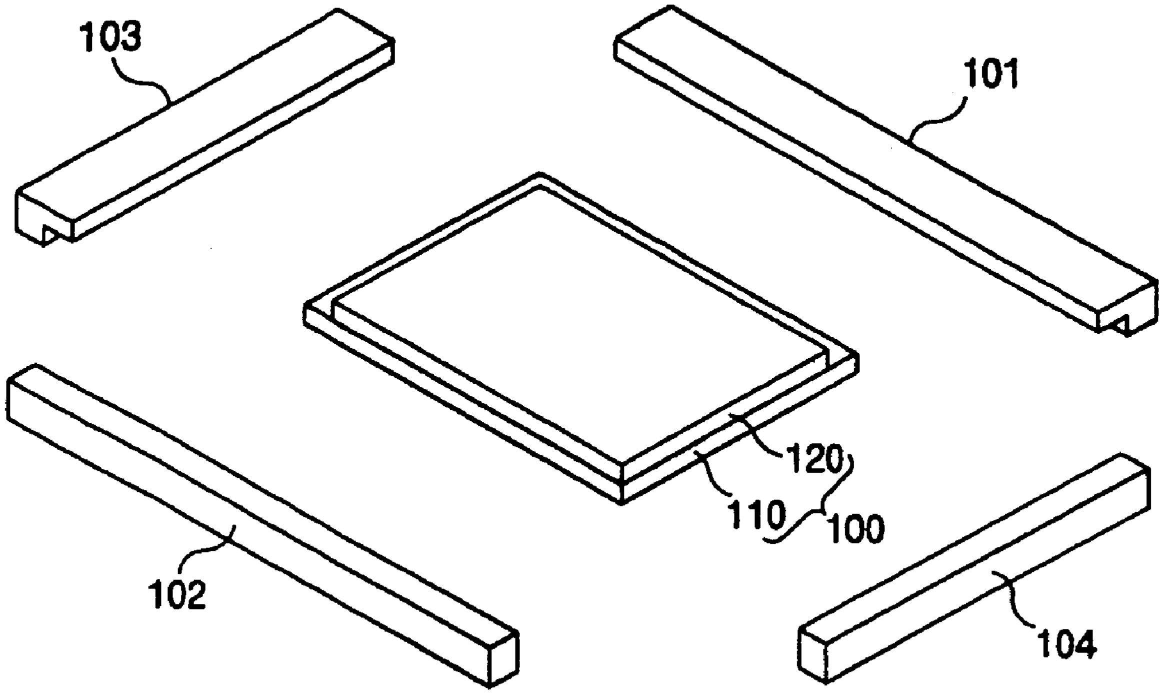
FIG.4A RELATED ART
FIGS. 4A to 4C are exemplary views showing a method for testing LCD panel according to the related art in order using the apparatus of FIG. 3.
Figure 4B:
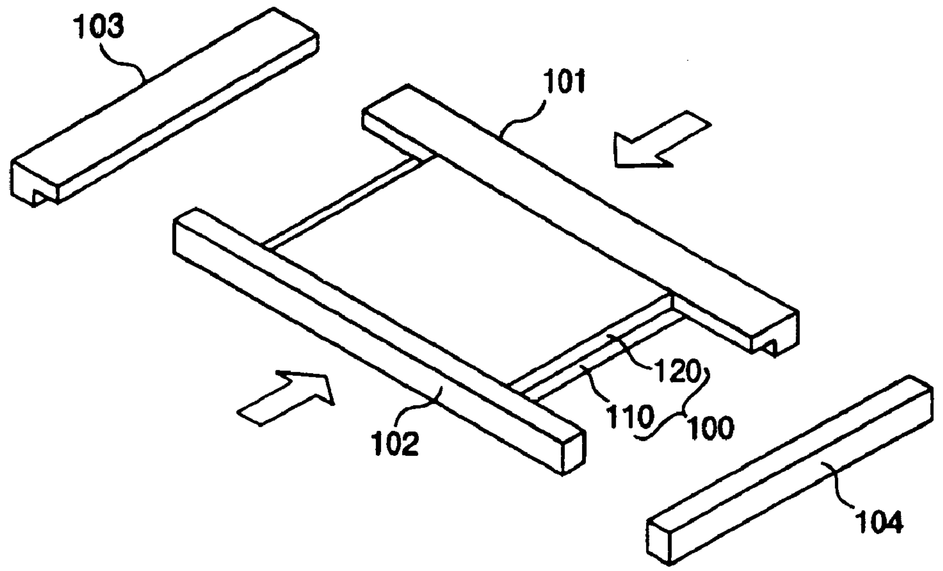
FIG.4B RELATED ART
Figure 4C:
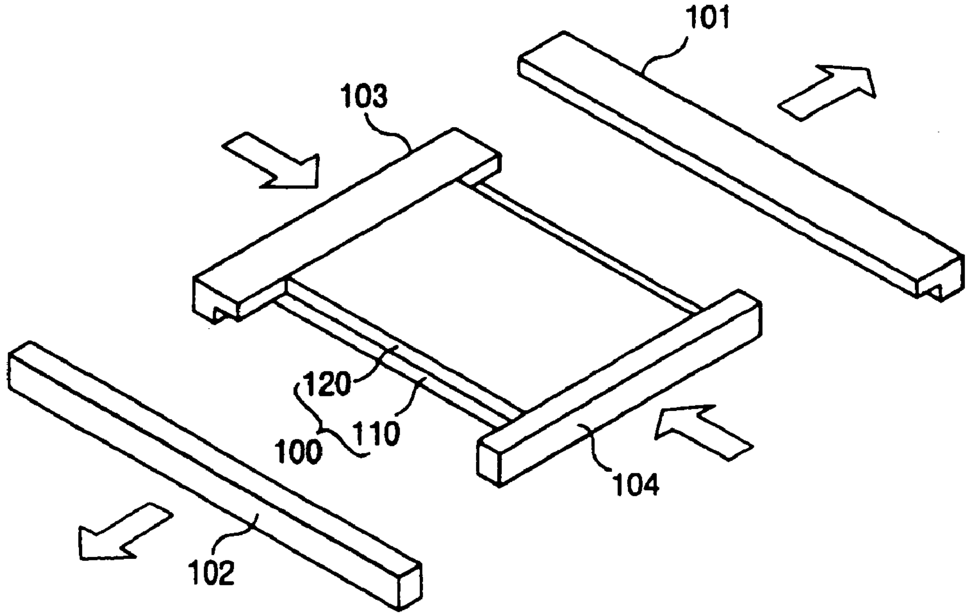
FIG.4C RELATED ART

Also, in the unit LCD panel 200, a color filter substrate 220 is stacked on a TFT array substrate 210, and two sides of the TFT array substrate 210 are formed to protrude beyond the color filter substrate 220. This is so that the gate pad unit and data pad unit can be formed at a marginal portion of the TFT substrate 210 that does not overlap the color filter substrate 220, as described with reference to FIG. 1.

Because of the protruding edge of the TFT array substrate 210, one of the longer sides and one of the shorter sides of the unit LCD panel 200 have a step shape. The first testing bar 201 corresponds to the one of the longer sides of the unit LCD panel 200 on which the data pad unit is formed. The third testing bar 203 corresponds to the one of the shorter sides of the unit LCD panel 200 on which the gate pad unit is formed. Thus, to test the longer sides of the unit LCD panel 200, the first testing bar 201 is formed to be engaged with the one of longer sides of the unit LCD panel 200 having the step shape. In addition, to test the shorter sides of the unit LCD panel 200, the third testing bar 203 is formed to be engaged with the one of shorter sides of the unit LCD panel 200 having the step shape.

Hereinafter, a method for testing unit LCD panel using the above apparatus will be described in detail with reference to FIGS. 6A to 6C.

Figure 6A:
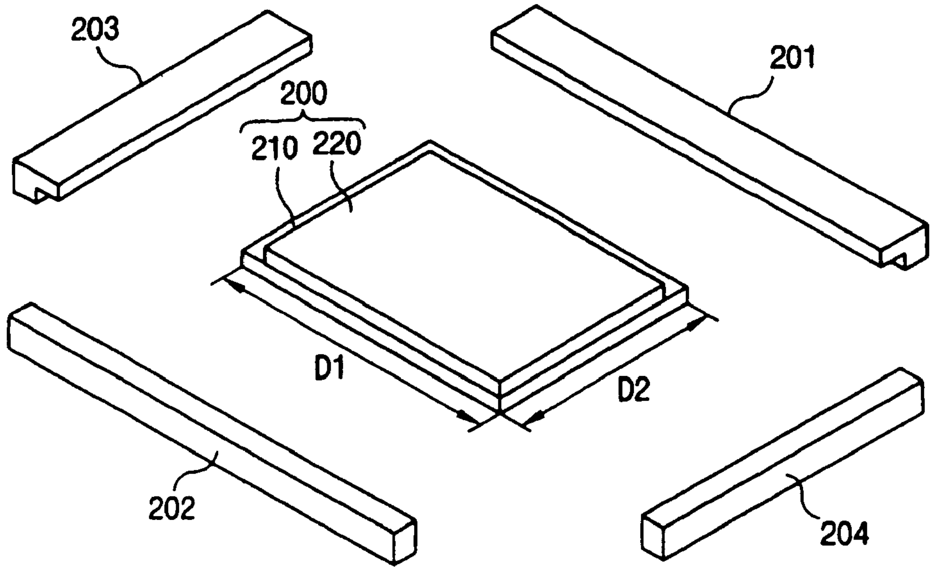
FIGS. 6A to 6*c* are exemplary views showing a method for testing LCD panel according to the embodiment of the present invention in order using the apparatus of FIG. 5.

As shown in FIG. 6A, the unit LCD panel 200 is loaded on a first table (not shown) on which the first to fourth testing bars 201 to 204 are disposed. At that time, the color filter substrate 220 is stacked on the TFT array substrate 210, and two side of the TFT array substrate 210 are formed to protrude beyond the color filter substrate 220 by the data pad unit and the gate pad unit as described above. The first testing bar 201 is formed to be engaged with the one of the longer sides of the unit LCD panel 200 having the step shape caused by the data pad unit. The third testing bar 203 is formed to be engaged with the one of the shorter sides of the unit LCD panel 200 having the step shape caused by the gate pad unit.

Figure 6B:
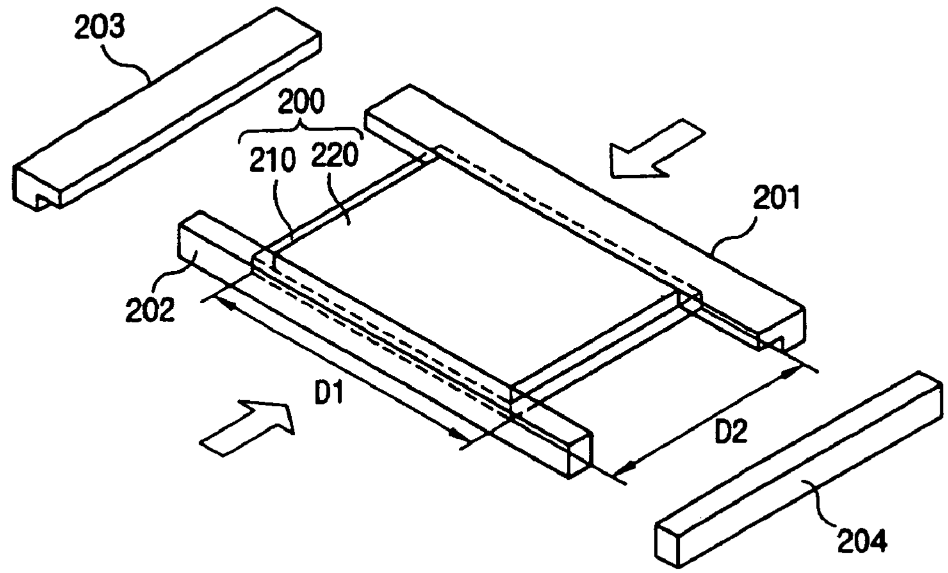

Next, as shown in FIG. 6B, the first and second testing bars 201 and 202 test whether or not the burr remains on the longer sides of the unit LCD panel 200 in the touch method and measure the distance D1 between the longer sides of the unit LCD panel 200.

Figure 6C:
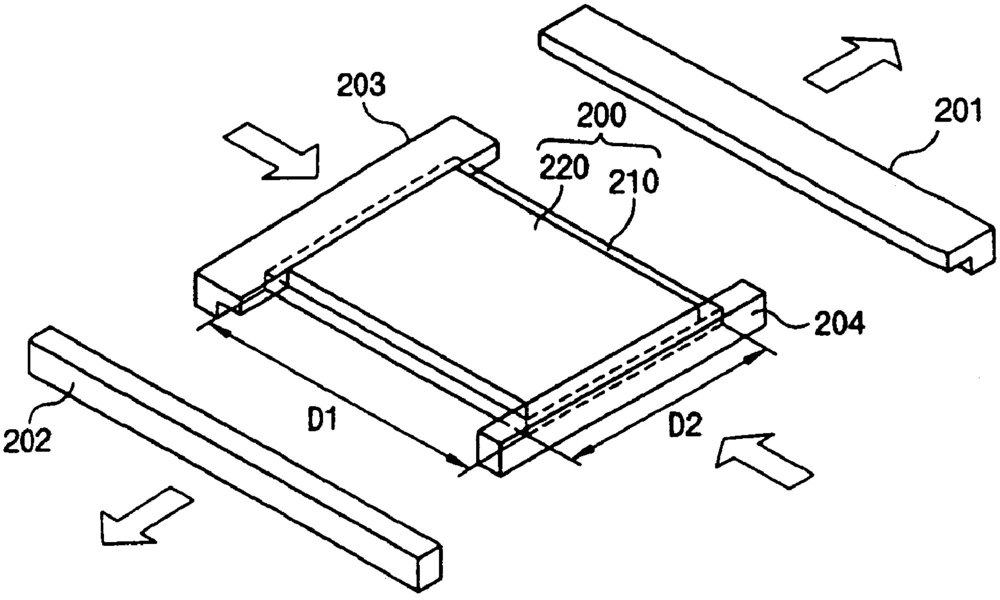

In addition, as shown in FIG. 6C, the third and fourth testing bars 203 and 204 test whether or not burr remains on the shorter sides of the unit LCD panel 200 in the touch method and measure the distance D2 between the shorter sides of the unit LCD panel 200.

As described above, the apparatus according to the embodiment of the present invention tests whether or not burr remains on the longer and shorter sides of the unit LCD panel 200 in the touch method using the first to fourth testing bars 201 to 204 and measures the distance D1 between the longer sides of the unit LCD panel 200 and the distance D2 between the shorter sides of the unit LCD panel 200. Thus, an additional measuring device as in the related art is not needed and sizes of all unit LCD panels 200 are tested.

Figure 7:
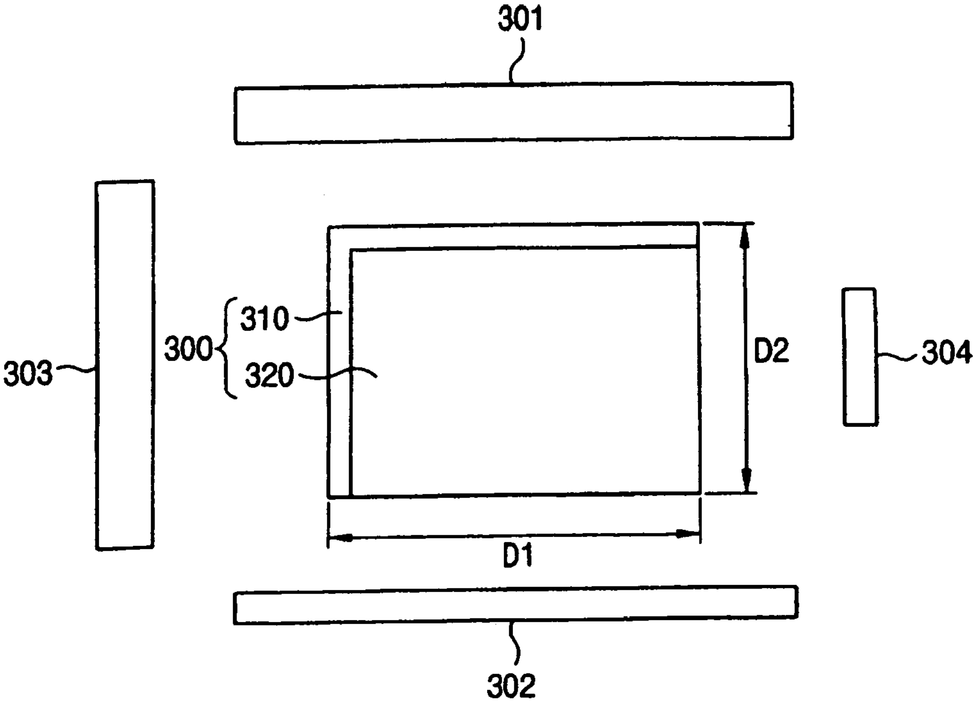
FIG. 7 is an exemplary view showing an apparatus for testing LCD panel according to another embodiment of the present invention.

On the other hand, FIG. 7 is an exemplary view showing an apparatus for testing LCD panel according to another embodiment of the present invention. As shown therein, the apparatus for testing LCD panel includes first and second testing bars 301 and 302 testing cutting status of longer sides of a unit LCD panel 300 (that is, a side where a data pad unit is formed and the opposite side) and measuring a distance (D1) between the longer sides of the unit LCD panel 300; and third and fourth testing bars 303 and 304 testing cutting status of shorter sides of the unit LCD panel 300 (that is, a side where a gate pad unit is formed and the opposite side), and measuring a distance (D2) between the shorter sides of the unit LCD panel 300. At that time, the fourth testing bar 304 is formed to corresponded to shorter sides of a model having the smallest size of unit LCD panel 300 unlike in the first embodiment of the present invention.

The first to fourth testing bars 301 to 304 measure the distance D1 between the longer sides of the unit LCD panel 300 and the distance D2 between the shorter sides of the LCD panel 300 using a built-in gauge.

Hereinafter, a method for testing unit LCD panel using the above apparatus according to another embodiment of the present invention will be described with reference to FIGS. 8A and 8B.

Figure 8A:
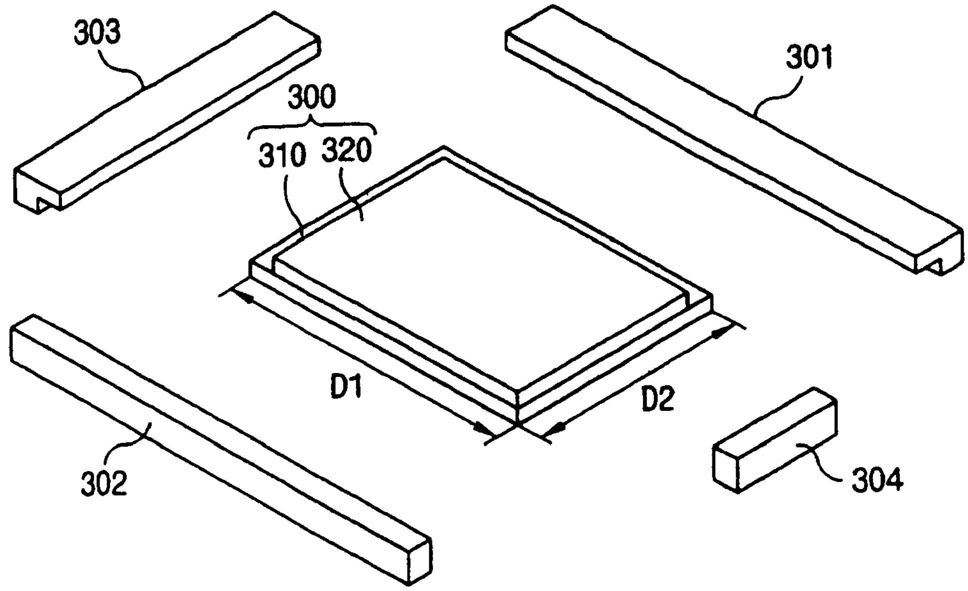
FIGS. 8A and 8B are exemplary views showing a method for testing LCD panel according to another embodiment of the present invention in order using the apparatus of FIG. 7.

As shown in FIG. 8A, the unit LCD panel 300 is loaded on a first table (not shown) including the first to fourth testing bars 301 to 304. At that time, the color filter substrate 320 is stacked on the TFT array substrate 310, and two side of the TFT array substrate 310 protrude beyond the color filter substrate 320 by the data pad unit and the gate pad unit as described above. The first testing bar 301 is formed to be engaged with the one of the longer sides of the unit LCD panel 300 having the step shape because of the data pad unit. The third testing bar 303 is formed to be engaged with the one of the shorter sides of the unit LCD panel 300 having the step shape because of the gate pad unit.

Figure 8B:
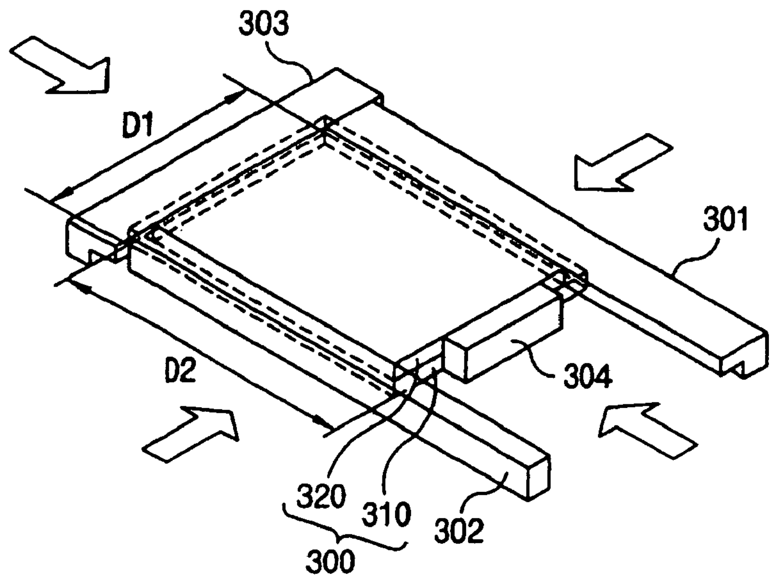

Next, as shown in FIG. 8B, the first to fourth testing bars 301 to 304 test whether or not burr remains on the longer sides and on the shorter sides of the unit LCD panel 300 in the touch method and measure the distance D1 and the distance D2 of the unit LCD panel 300.

As described above, according to another embodiment of the present invention, the first to fourth testing bars 301 to 304 are operated at the same time to test whether or not burr remains on the longer and shorter sides of the unit LCD panel 300 and to measure the distance D1 and the distance D2 of the unit LCD panel 300. Accordingly, if the first to fourth testing bars 301 to 304 are all fabricated to have the lengths corresponding to the longer and shorter sides of the largest unit LCD panel 300 model as in the first embodiment, the first and second testing bars 301 and 302 will contact the third and fourth testing bars 303 and 304 if all are applied to engage the unit LCD panel at the same time.

Therefore, in the another embodiment of the present invention, the fourth testing bar 304 is fabricated to have the length corresponding to the shorter sides of the smallest unit LCD panel 300 model to prevent the first and second testing bars 301 and 302 from contacting the third and fourth testing bars 303 and 304 when these four testing bars 301 to 304 are operated simultaneously.

Figure 8C:
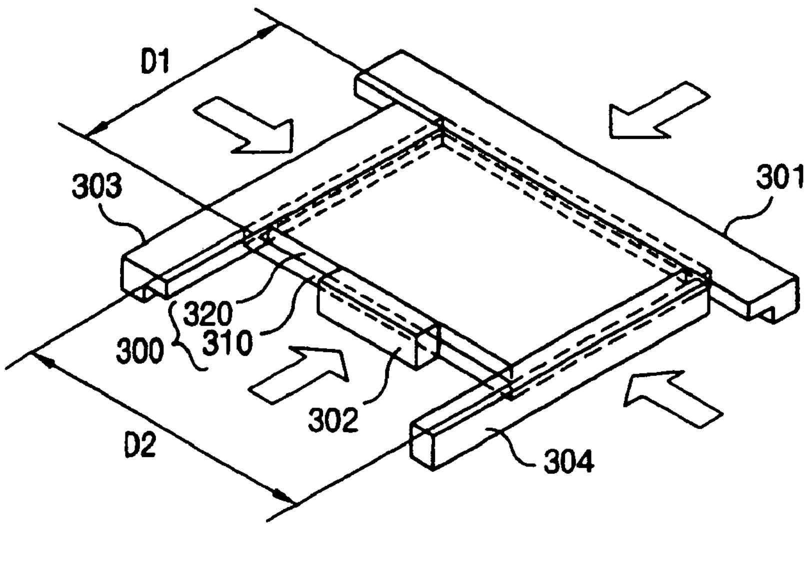

As illustrated in FIG. 8C, it is possible that one of the testing bars for testing the longer sides of the LCD panel may be formed to correspond the longer side of a model having the smallest size of LCD panel. Also, as illustrated in FIGS. 8B and 8C, the remaining testing a bars may be formed to correspond to the longest possible size of their corresponding LCD panel edges to be tested.

In addition to the distance measures described above, it is possible to measure the dimensions D1 and D2 across the top of the unit LCD panel by using corresponding measurement sensors or gauges on the upper step portion of one testing bar and on the testing bar for testing the opposite edge of the LCD panel. In such instance, the testing bar for testing the opposite edge may not have a step portion. Therefore, the height of the testing bar for testing the opposite edge should have a height that allows it to extend above the plane of the top surface of the unit LCD panel. Such sensor or gauge can be an optical measurement device.

It is also possible that the testing of a length of an edge corresponding to one of the testing bars can be measured by sensors on the single testing bar that comes into contact with the edge whose length is to be measured. Referring to FIG. 7, for example, testing bar 302 may measure the length D1 of the long edge of the unit LCD panel 300 without reference to the location of any other testing bar. Similarly, referring still to FIG. 7, for example, testing bar 303 may measure the length D2 of the short edge of the unit LCD panel 300 without reference to the location of any other testing bar.

According to the apparatus for testing LCD panel of the another embodiment, the test only can be performed for some portion of the shorter side of the unit LCD panel 300 corresponding to the fourth testing bar 304. However, testing of unit LCD panel 300, and measuring the distances D1 and D2 can be performed faster than the first embodiment of the present invention.

As described above, the apparatus and the method for testing LCD panel according to the present invention test whether or not burr remains on the longer sides and on the shorter sides of the unit LCD panel using the first to fourth testing bars in the touch method and measure the distance between longer sides and the distance between the shorter sides of the unit LCD panel using the gauge built in the first to fourth testing bars.

Therefore, the troublesome and inconvenient operations of related art such as extracting a unit LCD panel from the production line and moving it to an extra measuring device for testing the size of the LCD panel can be prevented. In addition, the time for testing the size of unit LCD panel can be reduced, and thereby, the productivity can be increased. An additional measuring device is not required and therefore, the costs for equipment and maintenance of the production line can be reduced.

Also, the size test can be performed for all unit LCD panels simply, and thereby the reliability of test can be improved as compared to the sampling method for extracting the unit LCD panel with a predetermined period and testing the size as in the related art.

In addition, in the related art, if the unit LCD panel is determined as inferior, the operation is stopped and all unit LCD panels from the panel sampled previously to the panel which will be sample next are tested to determine whether these are inferior or fine. Therefore, the unit LCD panels which have undergone the post-processes may be discarded, and accordingly, the material and time can be wasted. However, according to the present invention, the above problems can be prevented by testing all panels.

On the other hand, according to the apparatus and method for testing LCD panel of another embodiment of the present invention, the fourth testing bar is fabricated to have the length corresponding to the shorter side of the smallest unit LCD panel model, and thereby, the first to fourth testing bars can be operated at the same time to test whether or not burr remains on the longer sides and on the shorter sides of the unit LCD panel and to measure the distance between longer sides and the distance between the shorter sides of the LCD panel.

Therefore, according to another embodiment of the present invention, the testing for LCD panel and measuring the distances can be performed faster than the first embodiment of the present invention, and thereby, the productivity can be improved.

What is claimed is:

1. A method of testing a unit liquid crystal display panel, comprising:

loading the unit liquid crystal display panel having first facing sides and second facing sides on a table;

measuring a distance of first facing sides of the unit liquid crystal display panel using a first testing bar; and testing for burr on the first facing sides using the first testing bar and a second testing bar.

2. The method of claim 1, wherein the measuring and testing the first facing sides is conducted at the same time.

3. The method of claim 2, wherein the measuring and testing the first facing sides are both conducted using the first and second testing bars.

4. The method of claim 1, further comprising:

measuring a distance of second facing sides of the unit liquid crystal display panel using a third testing bar; and testing for burr on the second facing sides using the third testing bar and a fourth testing bar.

5. The method of claim 4, wherein the measuring and testing the second facing sides is conducted at the same time.

6. The method of claim 4, wherein the measuring and testing the second facing sides are both conducted using the third and fourth testing bars.

7. The method of claim 1, wherein the method of testing the unit liquid crystal display panel is a method of testing the unit liquid crystal display panel for inferior quality.

8. A method of testing a unit liquid crystal display panel, comprising:

loading the unit liquid crystal display panel having first facing sides and second facing sides on a table; and measuring a distance of first facing sides of the unit liquid crystal display panel and testing for burr on the first facing sides using a first pair of testing bars.

9. The method of claim 8, further comprising measuring a distance of second facing sides of the unit liquid crystal display panel and testing for burr on the second facing sides using second pair of testing bars.

10. The method of claim 8, wherein the method of testing the unit liquid crystal display panel is a method of testing the unit liquid crystal display panel for inferior quality.

* * * * *